(12) United States Patent
Pfaffinger et al.

(10) Patent No.: US 10,327,370 B2
(45) Date of Patent: Jun. 18, 2019

(54) POPULATION OF PRINTED CIRCUIT BOARDS

(71) Applicant: SIEMENS AKTIENGESELLSCHAFT, München (DE)

(72) Inventors: Alexander Pfaffinger, München (DE); Christian Royer, Ottobrunn (DE)

(73) Assignee: SIEMENS AKTIENGESELLSCHAFT (DE)

( * ) Notice: Subject to any disclaimer, the term of this patent is extended or adjusted under 35 U.S.C. 154(b) by 0 days.

(21) Appl. No.: 15/524,307

(22) PCT Filed: Oct. 2, 2015

(86) PCT No.: PCT/EP2015/072828
§ 371 (c)(1),
(2) Date: May 4, 2017

(87) PCT Pub. No.: WO2016/074851
PCT Pub. Date: May 19, 2016

(65) Prior Publication Data
US 2017/0318716 A1   Nov. 2, 2017

(30) Foreign Application Priority Data
Nov. 11, 2014   (DE) .................. 10 2014 222 936

(51) Int. Cl.
*H05K 13/04*   (2006.01)
*H05K 13/08*   (2006.01)
(Continued)

(52) U.S. Cl.
CPC .......... *H05K 13/08* (2013.01); *G05B 19/042* (2013.01); *G05B 19/4097* (2013.01);
(Continued)

(58) Field of Classification Search
None
See application file for complete search history.

(56) References Cited

U.S. PATENT DOCUMENTS 5,170,554 A    12/1992   Davis et al.
5,258,915 A *  11/1993   Billington ............ G06Q 10/04
                                                  700/103
(Continued)

FOREIGN PATENT DOCUMENTS

CN    102036549 A    4/2011
DE    69120887 T2    11/1996
(Continued)

OTHER PUBLICATIONS

International Search Report for PCT Application No. PCT/EP2015/072828, International Filing Date: Oct. 2, 2015; 2 pgs.
(Continued)

*Primary Examiner* — Ryan A Jarrett
(74) *Attorney, Agent, or Firm* — Schmeiser, Olsen & Watts, LLP

(57) ABSTRACT

To populate printed circuit boards by means of a pick-and-place line, multiple set-ups, each having an associated set-up family, are formed. A number of component types is associated with each set-up and a number of printed circuit board types is associated with each associated setup family, such that a printed circuit board of a printed circuit board type in a set-up family can be populated on the pick-and-place line using components of the component types associated with the set-up. A setting-up table comprising a stock of components of a component type in a set-up can be provided on the pick-and-place line. A method for populating the printed circuit boards includes the steps of recording printed circuit board types, from which printed circuit boards are to be populated with components of associated component types,
(Continued)

and associating recorded printed circuit board types with set-up families.

11 Claims, 3 Drawing Sheets

(51) Int. Cl.
*G05B 19/042* (2006.01)
*G05B 19/4097* (2006.01)

(52) U.S. Cl.
CPC ..... *H05K 13/0452* (2013.01); *H05K 13/0495* (2013.01); *H05K 13/085* (2018.08); *G05B 2219/45031* (2013.01)

(56) References Cited

U.S. PATENT DOCUMENTS

| | | | | |
|---|---|---|---|---|
| 5,390,283 | A * | 2/1995 | Eshelman | G06N 3/126 706/13 |
| 6,487,544 | B1 * | 11/2002 | Eshelman | G06N 3/126 706/13 |
| 2005/0284743 | A1 | 12/2005 | Takiguchi et al. | |
| 2006/0052893 | A1 * | 3/2006 | Yamazaki | H05K 13/08 700/100 |

FOREIGN PATENT DOCUMENTS

| | | |
|---|---|---|
| DE | 102012211810 A1 | 2/2014 |
| DE | 102012220904 A1 | 5/2014 |
| JP | 2006171916 A | 6/2006 |
| JP | 2009071137 A | 4/2009 |
| WO | WO 2014079601 A1 | 5/2014 |

OTHER PUBLICATIONS

Non-English Office Action for Japanese Application No. 2017-525616 dated Jun. 4, 2018.
Non-English Chinese Office Action dated Mar. 4, 2019 for Application No. 201580061271.0.

* cited by examiner

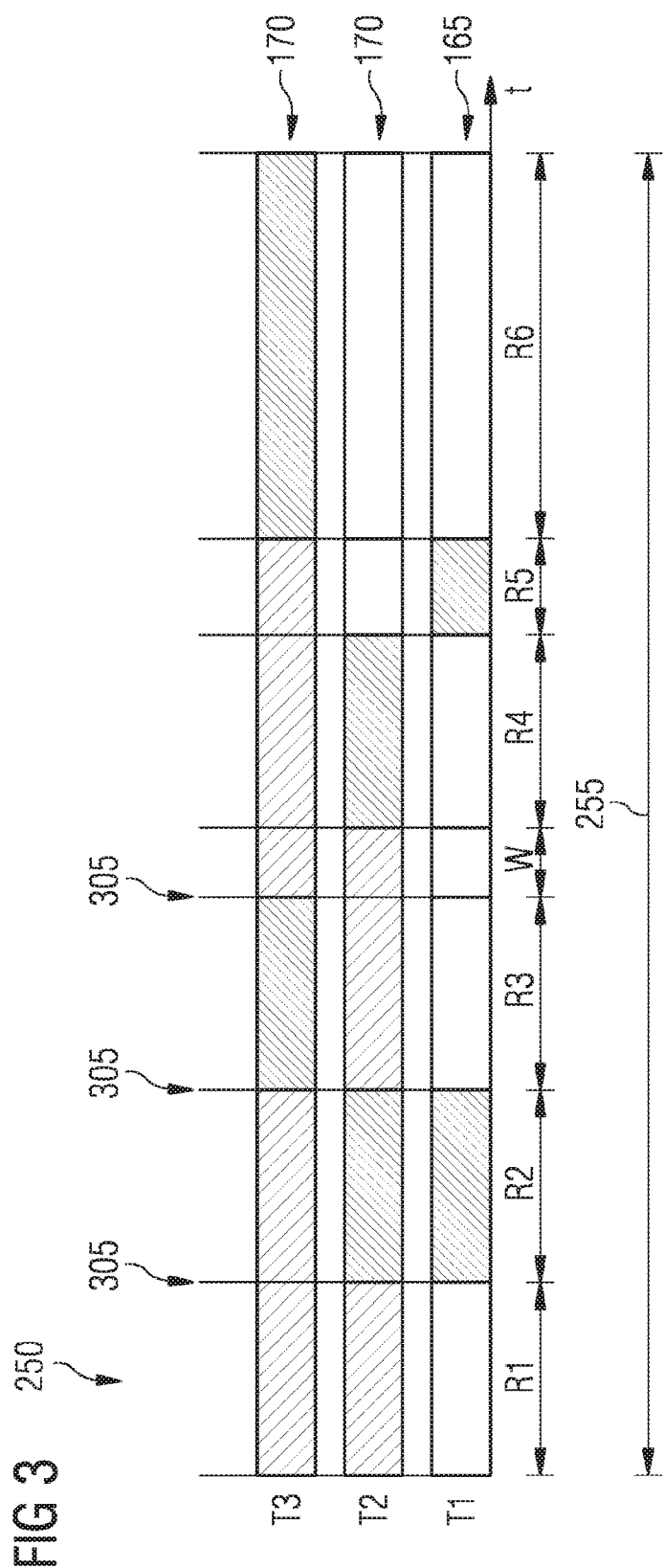

POPULATION OF PRINTED CIRCUIT BOARDS

CROSS-REFERENCE TO RELATED APPLICATIONS

This application claims priority to PCT Application No. PCT/EP2015/072828, having a filing date of Oct. 2, 2015, based off of DE Application No. 10 2014 222936.7 having a filing date of Nov. 11, 2014, the entire contents both of which are hereby incorporated by reference.

FIELD OF TECHNOLOGY

The following relates to a method and a system for the population of printed circuit boards. A pick-and-place line is required here, which is designed for the population of printed circuit boards with components.

BACKGROUND

An electronic module comprises a printed circuit board and components which are mechanically and electrically attached thereto. For printed circuit board production, the components are positioned on the printed circuit board using an automatic pick-and-place unit, and are then soldered thereto in a reflow kiln. A plurality of automatic pick-and-place units can be passed through sequentially in a pick-and-place line. For the production of multiple printed circuit boards, a population system comprising a plurality of pick-and-place lines can be employed.

A combination of component types on the automatic pick-and-place unit is described as a set-up. A set-up can be used to produce a quantity of different printed circuit boards, described as a set-up family. Customarily, however, printed circuit boards of a greater number of different printed circuit board types are to be produced than is possible with a single set-up, such that the set-up must be changed during production.

A set-up can be accommodated on one or more set-up tables, which can easily be replaced on the automatic pick-and-place unit. However, the fitting of a set-up table with components of predefined component types is frequently complex. Consequently, set-ups are frequently differentiated into fixed set-ups and variant set-ups, wherein a fixed set-up table is designed to maintain its combination of component types over a predefined planning horizon, whereas a variant set-up table can foreseeably be refitted within said planning horizon.

DE 10 2012 220 904 A1 relates to a method for the determination of a fixed set-up for a pick-and-place line.

SUMMARY

Frequently, however, notwithstanding highly-optimized set-ups or set-up families, pick-and-place line operation is subject to temporary interruptions in production, as production using a first set-up installed on the pick-and-place line is already completed before all the set-up tables of a second set-up can be equipped with the required components. An aspect relates to an improved technique for the population of printed circuit boards.

For the population of printed circuit boards using a pick-and-place line, multiple set-ups, each having associated set-up families, are formed. A number of component types is associated with each set-up and a number of printed circuit board types is associated with each associated set-up family, such that a printed circuit board of a printed circuit board type in a set-up family can be populated on the pick-and-place line using components of the component types in the set-up. A set-up table comprising a stock of components of a component type in a set-up can be provided on the pick-and place line. A method for populating printed circuit boards comprises steps of the recording of printed circuit board types, of which printed circuit boards are to be populated with components of associated component types, and the association of recorded printed circuit board types with set-up families. A sequence is then determined, in which the set-ups of the set-up families that have been formed are to be fitted on the pick-and-place line, and the sequence is optimized with respect to a predetermined criterion. Printed circuit boards can then be populated in the predetermined sequence, using set-ups.

By the formation of a sequence, set-up changeovers which constitute a physical intervention in the equipment of the pick-and-place line can be taken into consideration. For example, it can be ensured that set-up changeovers are not executed which are excessive in number, excessively rapid in sequence or excessive in scope. The stopping and restarting of the pick-and-place line can thus be reduced. Moreover, set-ups can be appraised realistically, in consideration of the transitions thereof in the form of set-up changeovers. The sequence of set-ups is thus no longer random, but is subject to the criterion to be optimized.

The criterion can assume a number of forms. For example, the criterion can comprise one of the following: a number of set-ups, a number of set-up changeovers, a number of stocks of components to be installed on set-up tables, and a production volume in a fixed set-up. A plurality of the aforementioned variables can also be combined to form a single criterion, for example in the form of an un-weighted or weighted total.

Customarily, the sequence comprises at least two set-ups, wherein a first set-up is followed by a second set-up. In a preferred form of embodiment, the criterion comprises that a waiting time between the end of the population of printed circuit boards using the first set-up and the completed delivery of a set-up table with a stock of components of a component type for the second set-up is as short as possible. Ideally, as often as possible, the waiting time is zero. Negative values, when all the set-up tables for the second set-up can be prepared before population using the first set-up is complete, are not considered here.

A waiting time can have a particularly critical impact upon the capacity utilization or efficiency of the pick-and-place line. By minimizing the waiting time, the pick-and-place line can thus be operated in an improved cost-saving or resource-saving manner.

It is particularly preferred that a total waiting time, composed of a combination of the waiting times during all the set-up changes in the sequence, is minimized. The tolerance of individual waiting times can thus be improved, in order to achieve a superior overall result with a reduced overall waiting time.

One of the specified set-ups can be a fixed set-up, of which the component types remain fitted in an unchanged manner on one or more set-up tables for as long as printed circuit boards are populated using set-ups in the determined sequence.

By the employment of a fixed set-up, waiting times can be eliminated, in that the sequence is constituted such that the fixed set-up is installed on the pick-and-place line if no other set-up is available. Population of the complete batch of printed circuit board types to be populated using the fixed set-up does not need to be executed continuously; if instead, the fixed set-up can be replaced with a variant set-up, immediately the latter is available for fitting purposes. Accordingly, an increased number of set-up changeovers to a variant set-up can be achieved using the fixed set-up, with no waiting times. In one form of embodiment of the method, a fixed set-up is always present in the sequence between two variant set-ups.

The association of printed circuit board types with set-up families can be repeated with at least one modified parameter, in order to optimize the criterion. In other words, the association, the determination of the sequence, and the optimization of the sequence can be executed with variation of one or more parameters. It can thus be determined which parameter or combination of parameters significantly influences the improvement of the criterion. Population of printed circuit boards can thus be based upon an improved sequence of set-up families or set-ups.

In a particularly preferred form of embodiment, the parameter comprises a selection of associated printed circuit board types from the quantity of printed circuit board types recorded. It is assumed that the quantity of printed circuit board types recorded is greater than the quantity of associated printed circuit board types. The selection of the subset from the superset can have a significant influence upon the criterion. For example, a printed circuit board type which is poorly combinable with other printed circuit board types can be removed from the quantity of associated printed circuit board types, such that the remaining printed circuit board types can be brought into an improved sequence. The printed circuit board type that was first rejected can be combined subsequently with other printed circuit board types which, at that point, are included in the quantity of printed circuit board types recorded.

The parameter can also comprise the quantity of printed circuit board types recorded. For example, between two executions of the method, the quantity of printed circuit board types recorded can have been expanded to include a new order. The quantity can also have been reduced if, for example, by a different method, printed circuit board types have been assigned to another pick-and-place line. A population system can thus operate with a plurality of pick-and-place lines, employing individual association methods.

Additionally or alternatively, the parameter can comprise a fixed set-up comprising set-up tables, the associated component types of which do not change, a priority, which is assigned to an order for the population of printed circuit boards, a set-up fullness factor, a number of printed circuit board types in a set-up family, or another variable.

In a further form of embodiment, a combination of multiple criteria can also be employed. In one form of embodiment, the criteria can also be weighted.

A computer program product (non-transitory computer readable storage medium having instructions, which when executed by a processor, perform actions) comprises program code means for the execution of the method described above, if the computer program product is run on a processing device or saved on a computer-readable medium.

A system for the population of printed circuit boards comprises a pick-and-place line and a processing device for the execution of the method described above.

BRIEF DESCRIPTION

Some of the embodiments will be described in detail, with reference to the following figures, wherein like designations denote like members, wherein:

FIG. 3 shows a sequence of set-ups on a pick-and-place line in the population system represented in FIG. 1, in accordance with embodiments of the present invention.

DETAILED DESCRIPTION

Figure 1:
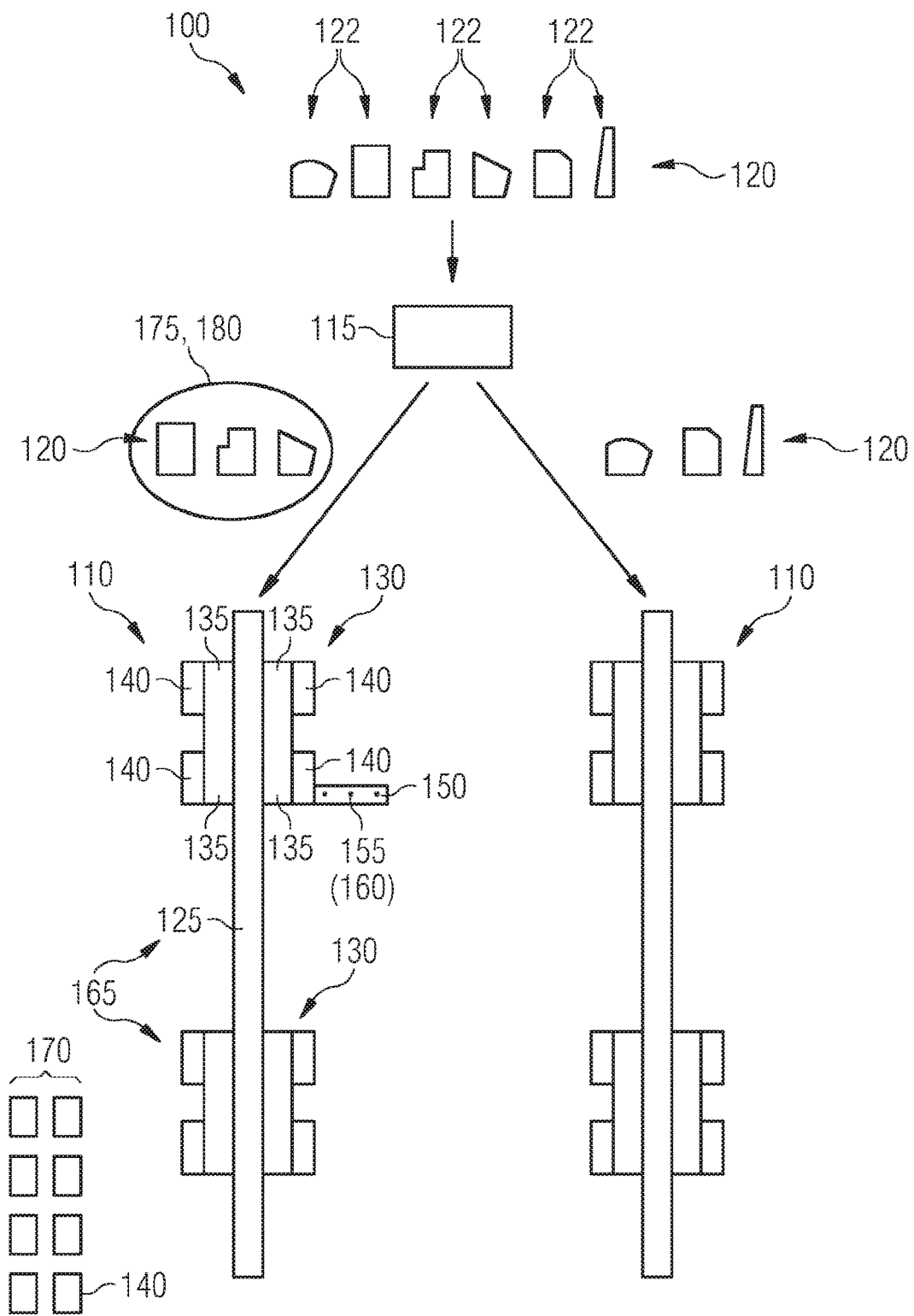
FIG. 1 shows a population system, in accordance with embodiments of the present invention.

FIG. 1 shows an exemplary population system 100. The population system 100 comprises one or a plurality of pick-and-place lines 110 and a processing or control device 115. Each pick-and-place line 110 comprises an optional transport system 125, and one or a plurality of automatic pick-and-place units 130. Each automatic pick-and-place unit 130 comprises one or a plurality of pick-and-place heads 135, each of which is designed to pick up a component 155 from a set-up table 140 and to place the latter at a predefined position on the printed circuit board 120, which is located on the transport system 125. During the population process, the printed circuit board 120 customarily remains stationary relative to the automatic pick-and-place unit 130.

The set-up tables 140 customarily comprise a plurality of infeed devices 150, only one of which is represented in FIG. 1, for exemplary purposes. Each infeed device 150 contains a stock of components 155 of a predefined component type 160. For the components 155, the infeed device 150 customarily has a capacity, which can be expressed in terms of tracks. A track is customarily 8 mm wide, and the number of tracks on a set-up table 140 is limited, for example to 40. Components 155 of the same component type 160 are customarily provided on a belt, on a tray or in a tube.

Each component type 160 requires a predefined number of tracks on the infeed device 150 and on the set-up table 140, which tracks are customarily mutually adjoining. In the interests of simplicity, the number of components 155 of a component type 160 in an infeed device 150 is considered here to be practically inexhaustible, such that replenishment is not required. An infeed device 150 can generally be configured to contain components 155 of different component types 160, and different infeed devices 150 can customarily be fitted to a set-up table 140.

If, on the automatic pick-and-place unit 130, a component 155 of a component type 160 is required which is not present on one of the set-up tables 140, the arrangement of components 155 on one of the set-up tables 140 fitted is not customarily altered, but rather the set-up table 140 is entirely replaced with another, appropriately populated set-up table 140.

A set-up 165, 170 comprises a quantity of component types 160, and is constituted using one or more set-up tables 140, each of which is equipped with stocks of components 155 of the component types 160 in the set-up 165, 170, in order to be fitted to a pick-and-place line 110. A distinction can be drawn between fixed set-ups 165 and variant set-ups 170. A fixed set-up 165 is designed for remaining fitted to the set-up table(s) 140, in an unchanged manner, over a predefined planning horizon, whereas a variant set-up 170 is designed for remaining fitted only temporarily to one or more set-up tables 140 within the planning horizon. The planning horizon can, for example, be of the order of one to approximately 10 days. The duration of constitution of a variant set-up 165 on one or more set-up tables 140 is customarily significantly shorter than the planning horizon.

This duration can, for example, be a number of hours or days, but is customarily not longer than one week.

A set-up family 175, 180 comprises a plurality of printed circuit board types 122, and is associated with exactly one set-up 156, 170, and vice versa. A distinction can be drawn between a set-up family of the fixed set-up type 175, and a set-up family of the variant set-up type 180. A set-up family of the fixed set-up type 175 is associated with a fixed set-up 165, and comprises printed circuit board types 122, the associated printed circuit boards 120 of which can be entirely populated with components 155 of component types 160 in the associated fixed set-up 165. Correspondingly, a set-up family of the variant set-up type 180 is associated with a variant set-up 170, and comprises printed circuit board types 122, the associated printed circuit boards 120 of which can be entirely populated with components 155 of component types 160 in the associated variant set-up 170.

In the operation of the pick-and-place line 110, various set-ups 165, 170 are applied sequentially on the pick-and-place line 110, for the population of the respective associated printed circuit boards 120. A change of set-up 165, 170 on the pick-and-place line 110 is described as a set-up changeover, and customarily requires a shutdown of the pick-and-place line 110.

For the constitution of a fixed set-up 165 or a variant set-up 170, one or more set-up tables 140, while the latter are not installed on the pick-and-place line 110, are customarily equipped with stocks of components 155 of predefined component types 160. Previously-fitted components 155 of component types 160 which are not required can be removed beforehand, or can remain fitted. This process is described as prefitting, and can require a processing time of the order of one or more hours, for example approximately 6-10 hours.

In order to minimize the complexity of fitting and removal and of set-up changeover associated with a variant set-up 170, it is customarily endeavored to include as many printed circuit board types 122 as possible in fixed set-ups 165. In practice, however, a targeted arrangement with no variant set-ups 170 is virtually unachievable.

In the operation of the pick-and-place line 110, the composition of set-up families 175, 180 or of set-ups 165, 170 is critical. In the constitution thereof, secondary conditions may need to be considered, for example compliance with a limited capacity of a set-up table 140 for component types 160, or a grouping of predefined printed circuit board types 160 in the same set-up family 175, for example on the grounds of the use of lead-based or lead-free solder.

The constitution of set-up families 175, 180 or set-ups 165, 170 can be executed using the control device 115. The control device 115 can also define a sequence in which set-ups 165, 170 are to be fitted on the pick-and-place line 110. Moreover, the control device 115 can control the population operation on one pick-and-place line 110, or on the entire population system 100.

Figure 2:
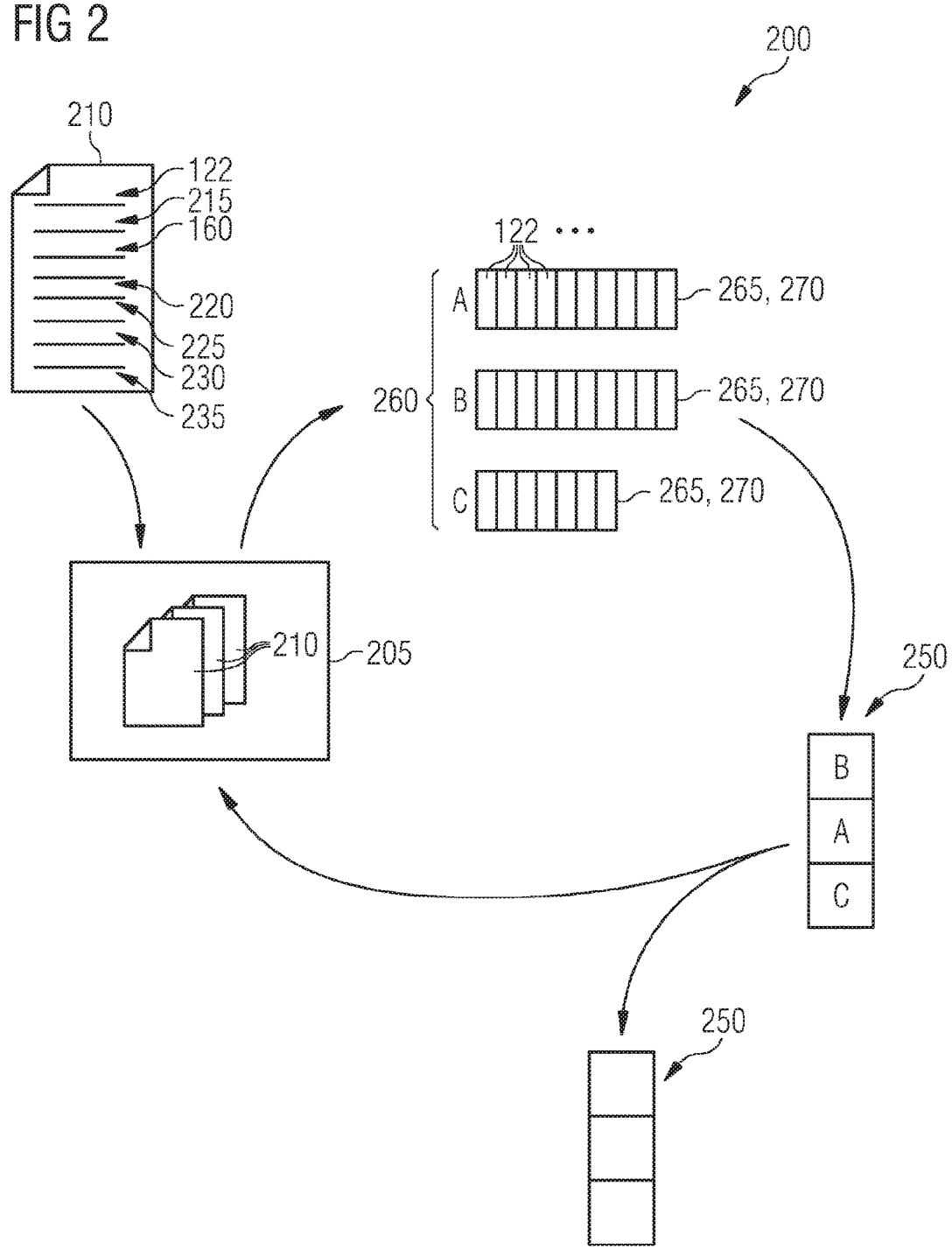
FIG. 2 shows a flow diagram of a method for the determination of a sequence of set-ups on a pick-and-place line in the population system represented in FIG. 1, in accordance with embodiments of the present invention.

FIG. 2 shows a flow diagram 200 of a method for the determination of a sequence of set-ups on a pick-and-place line 110 in the population system 100 represented in FIG. 1.

A quantity 205 of orders 210 is assumed, which are to be executed as efficiently as possible using a pick-and-place line 110. Each order 210 customarily comprises at least one printed circuit board type 122 and a batch 215 of printed circuit boards 120 to be populated. One or more component types 160 are associated with the printed circuit board type 122, of which component types components 155 are to be fitted to the individual printed circuit boards 120.

Further additional information can be associated with a printed circuit board type 122. For example, a number 220 of component types 160 to be fitted to each printed circuit board 120, a number 225 of population positions on a printed circuit board 120, or a production time 230 for a printed circuit board 120 can be specified. The number 225 of population positions customarily corresponds to the number of components 155 to be fitted to a printed circuit board 120 of the printed circuit board type 122, regardless of the component type 160.

A priority 235 can be assigned to an order 210, which priority indicates the urgency with which the order 210 is to be executed.

The method 200 takes orders 210 from the quantity 205, and constitutes a sequence 250 of set-ups 165, 170 therefrom. Here d, the method 200 can involve multiple and sequential access operations to the quantity 205. Between two such access operations, the quantity 205 may have changed, for example as a result of the take-up of orders 210 by another method, or the addition of a newly-received order 210.

The method can be applied as a simulation, in order to permit the rapid and automated analysis of the influence of different parameters. These parameters can include strategic parameters, which can differ substantially between a plurality of pick-and-place lines 110. These parameters can include, for example, one or more of the following:
  the length of a planning horizon;
  a predefined fixed set-up 165 and an associated set-up family of the fixed set-up type 175; information on the pick-and-place line 110 or the printed circuit board types 122 to be processed, for example
    a minimum track requirement for a component 155 on a shuttle table 140;
    a number of available shuttle tables 140;
    the capacities of the individual shuttle tables 140;
    permissible component types 160 for the individual shuttle tables 140;
  a maximum order volume which can be deferred to a subsequent planning horizon;
  a fullness factor for a shuttle table 140 given by stocks of components 155 of a component type 160 in a variant set-up 170; or
  statistical parameters.

Customarily, the object of the method 200 is limited to the operation of the pick-and-place line 110 over a preset planning horizon 255. To this end, set-ups are defined which permit the most effective capacity utilization possible of the pick-and-place line 110 within the planning horizon 255, thus permitting efficient production. The planning horizon 255 can comprise a preset duration of, for example, one or more days, or approximately one week. The term of the planning horizon 255 is customarily determined with reference to technical criteria for the pick-and-place line 110 and, where applicable, information on customary incoming order numbers on the pick-and-place line 110.

In the context of the method 200, from the starting quantity 205, a sub-quantity 260 of orders 210 or printed circuit board types 122 can be constituted, in order to reduce the basic quantity for the constitution of an association of printed circuit board types 122 to the pick-and-place line 110 to a reasonable amount. As shown in greater detail hereinafter, the sub-quantity 260 can also be constituted successively, wherein the latter can be adjusted, where applicable, in successive executions of the method 200.

Circuit board types 122 in the sub-quantity 260 are grouped to form one or more set-up families. A distinction can be drawn between a set-up family of the fixed set-up type 175 and a set-up family of the variant set-up type 180.

A set-up family of the fixed set-up type 175 is associated with a fixed set-up 165 which is designed to remain constituted in an unchanged manner on one or more set-up tables 140 within the planning horizon 255. Conversely, a set-up family of the variant set-up type 180 is associated with a variant set-up 170 which is designed for only temporary constitution on a set-up table 140 within the planning horizon 255, and then to be entirely or partially removed therefrom again. A set-up table 140 which is used for the constitution of a variant set-up 170 is refitted at least once within the planning horizon 255 wherein, on each occasion, the composition of stocks of components 155 of the component types 160 on set-up table 140 is modified.

Three set-up families 175, 180, designated as A, B and C, are formed in an exemplary manner in the representation in FIG. 2. A number of printed circuit board types 122 is associated with each set-up family 175, 180.

Different methods are available for the association of printed circuit board types 122 with set-up families 175, 180. Preferably an association is defined, and is improved using linear optimization methods. Linear optimization forms the basis of the solution procedures for (mixed) whole-number linear optimization.

The advantages of linear optimization are as follows:
Provision of an overall optimization approach
Easily extendable
Commercial availability of highly effective standard solvers (Ilog, Gurobi, Xpress), which are widespread and proven in practice
For an established solution, the maximum margin (gap) between the latter and the optimum solution is known.
By the application of mathematical methods, clearly superior solutions for the association of printed circuit board types 122 with set-up families 175 can be achieved than with procedures previously applied in practice.

Various methods for optimization can be applied, for example on the basis of local search functions or meta-heuristic algorithms. Preferably, however, an IP model (integer programing or integer program, or a mixed whole-number optimization model) is employed. One of the main methods in the field of mathematical optimization is linear optimization, which involves the optimization of linear target functions for a quantity, which is restricted by linear equalities and inequalities.

In one form of embodiment, association is geared towards the identification of set-up families 175, 180 having a predefined quality with respect to a predefined criterion. For example, the criterion can be the utilization of available space on a set-up table 140 by components 155 in a set-up 165, 170 which is associated with the set-up family. If, for example, less than approximately 75% of the available space is occupied by components 155, the set-up family 175, 180 can be discarded. Orders 210 which, together with the associated printed circuit board types 122, have already been removed from the quantity 205 can, upon discarding, be re-assigned to the quantity 205. In the example shown in FIG. 2, set-up family C might be an under-occupied set-up family 175, 180 of this type, which can be discarded.

In a subsequent step, the set-up families 175, 180 are arranged in a sequence 250. Herein or thereafter, the sequence 250 is optimized with respect to a predefined criterion. This criterion can comprise, for example, the minimization of a number of set-ups 175, 180, or of a number of set-up changeovers between the set-ups 175, 180. A number of stocks of components 155 which are to be installed on a set-up table 140 in a set-up 175, 180, can be intended to be maximized in accordance with the criterion. Conversely, a production volume of printed circuit boards 120 using a set-up family of the fixed set-up type 175 can be intended to be maximized. The production volume can relate to the number of printed circuit boards 120 populated. A plurality of weighted or un-weighted characteristic values can also be combined for the constitution of a criterion.

The defined sequence 250 of set-ups 175, 180 can be provided as the result of the method 200. A plurality of sequences 250 can also be defined, which achieve a predefined quality with respect to the criterion. Selection of one of the sequences 250 can then proceed on the basis of further parameters.

It is preferred that the method 200 should be executed a number of times, in order to optimize the sequence 250. Preferably, one or more parameters are varied over the course of the various runs of the method 200. Specifically, the constitution of the sub-quantity 260 from the quantity 205 can be varied. Other variable parameters can include, for example, a number or composition of a fixed set-up 165 with an associated set-up family of the fixed set-up type 175, the priority 235 of an order 210 which is assigned to a printed circuit board type 122, the above-described fullness factor of a set-up 175, 180, or the number of printed circuit board types 122 in a set-up family 175, 180. Combinations of a plurality of parameters are also possible. Moreover, between individual runs of the method 200, the quantity 205 can have been varied in composition or size.

The method 200 preferably runs until such time as a sequence 250 is identified, the quality of which achieves a predefined threshold value with respect to the criterion described, or until a predefined detection time for the method 200 has elapsed. If, within this detection time, no satisfactory sequence 250 has been able to be identified, for the purposes of a further detection, for example, secondary conditions for the constitution of set-up families 175, 180 or the threshold value for the requisite quality can be adjusted.

Thereafter, preferably, the set-ups 175, 180 in the sequence 250 are delivered sequentially on the pick-and-place line 110, and are used for the population of printed circuit boards 120 in the corresponding set-up families 175, 180.

FIG. 3 shows a sequence 250 of set-ups 175, 180 on a pick-and-place line 110 in the population system 100 represented in FIG. 1. Time is plotted in the horizontal direction. In the example shown in FIG. 3, each set-up 175, 180 is represented respectively by a set-up table 140 T1 to T3. The set-up tables T1 to T3 are plotted vertically, and are each represented by a horizontal bar, which is filled with light, downwardly-inclined hatching, where the set-up table T1 to T3 is being equipped in the pre-fitting stage, and with heavy, upwardly-inclined hatching, where the set-up table T1 to T3 is fitted to the pick-and-place line 110. If a set-up table T1 to T3 is not employed, no hatching is shown in the corresponding bar. In the example shown in FIG. 3, the set-up table T1 carries a fixed set-up 165, and the set-up tables T2 and T3 each carry a variant set-up 170.

At the start of the planning horizon 255, a first set-up R1 is firstly fitted to the pick-and-place line 110, which is comprised by the fixed set-up 165. Correspondingly, the set-up table T1 is installed on the pick-and-place line 110, whereas the set-up tables T2 and T3 are available for population with components. If the production time for the first set-up R1 is complete, a set-up changeover 305 then ensues to a second set-up R2. The second set-up comprises component types 160 in the variant set-up 170, which are fitted to the shuttle table T2. During the population of printed circuit boards 120 using the second set-up R2, the pre-fitting of the set-up table T3 can continue.

After a further set-up changeover 305, a third set-up R3 is delivered at the pick-and-place line 110, which comprises only component types 160 which are fitted to the set-up table T3. While population proceeds using the set-up R3, the set-up table T2 can be refitted.

In the present example, however, the refitting of the set-up table T2 takes longer than the population operation using the third set-up R3. If the set-up R3 is to be followed by a set-up R4, which requires component types 160 which need to be fitted to the set-up table T2, a waiting time W may be necessary, during which no production proceeds using the pick-and-place line 110.

During population using the set-up R4, the third set-up table T3 can be refitted. If refitting requires longer than the production time using the set-up R4, in order to avoid an additional waiting time between the set-up R4 and a set-up R6 which requires component types 160 which are fitted to the set-up table T3, a set-up R5 can be interposed, which is comprised by the fixed set-up 165. Where applicable, the set-up R5 can also incorporate component types 160 which are present on the set-up table T2.

It is clear that the sequence 250 of set-ups R1 to R6 is decisive in establishing whether and when waiting times W are to be incorporated, and the amount of time required for this purpose. In this regard, the avoidance of waiting times W is only substitutional for one of a number of possible criteria for the optimization of the sequence 250 of set-up families 175, 180 on the pick-and-place line 110.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

The invention claimed is:

1. A method for populating printed circuit boards using a pick-and-place line,
wherein multiple set-ups, each having associated set-up families, are provided;
wherein a plurality of component types is associated with each set-up and a plurality of printed circuit board types is associated with each set-up family, such that a printed circuit board of a printed circuit board type in a set-up family is populated on the pick-and-place line using components of the plurality of component types in the set-up;
wherein one or more set-up tables comprising a stock of components of a component type in a set-up is provided on the pick-and place line, wherein the component type of each set-up table is not altered, the method comprising:
recording printed circuit board types, of which printed circuit boards are to be populated with components of associated component types;
associating the recorded printed circuit board types with set-up families;
determining a sequence in which the set-ups of the set-up families that have been formed are to be fitted on the pick-and-place line;
optimizing the sequence with respect to a predetermined criterion, and
populating the printed circuit boards in the predetermined sequence, using set-ups.

2. The method as claimed in claim 1, wherein the predetermined criterion comprises one of the following: a plurality of set-ups, a plurality of set-up changeovers, a plurality of stocks of components to be installed on set-up tables, and a production volume in a fixed set-up.

3. The method as claimed in claim 1, wherein in the sequence, a first set-up is followed by a second set-up, and the predetermined criterion comprises a waiting time between an end of the populating the printed circuit boards using the first set-up and the completed delivery of a set-up table with a stock of components of a component type for the second set-up is as short as possible.

4. The method as claimed in claim 1, wherein one of the specified set-ups is a fixed set-up, of which the component types remain fitted in an unchanged manner on one or more set-up tables for as long as printed circuit boards are populated using set-ups in the determined sequence.

5. The method as claimed in claim 1, wherein associating the printed circuit board types with set-up families is repeated with at least one modified parameter to optimize the predetermined criterion.

6. The method as claimed in claim 5, wherein the at least one modified parameter comprises a selection of associated printed circuit board types from the plurality of printed circuit board types recorded.

7. The method as claimed in claim 5, wherein the at least one modified parameter comprises the plurality of printed circuit board types recorded.

8. The method as claimed in claim 5, wherein the at least one modified parameter comprises at least one of the following variables:
a fixed set-up comprising set-up tables, the associated component types of which do not change;
a priority, which is assigned to an order for the population of printed circuit boards;
a set-up fullness factor; and
a plurality of printed circuit board types in a set-up family.

9. The method as claimed in claim 8, wherein a weighted combination of multiple criteria is employed.

10. A computer program product, comprising a computer readable hardware storage device having computer readable program code stored therein, said program code executable by a processor of a computer system to implement a method as claimed in claim 1.

11. A system for populating printed circuit boards, comprising:
a pick-and-place line; and
a processing device for the execution of the method as claimed in claim 1.

* * * * *